United States Patent
Kwon et al.

(10) Patent No.: US 12,232,393 B2
(45) Date of Patent: Feb. 18, 2025

(54) DISPLAY APPARATUS

(71) Applicant: Samsung Display Co., Ltd., Yongin-si (KR)

(72) Inventors: Junghyun Kwon, Yongin-si (KR); Youngmin Kim, Yongin-si (KR); Kisoo Park, Yongin-si (KR); Seontae Yoon, Yongin-si (KR); Hyeseung Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 637 days.

(21) Appl. No.: 17/483,080

(22) Filed: Sep. 23, 2021

(65) Prior Publication Data

US 2022/0262864 A1    Aug. 18, 2022

(30) Foreign Application Priority Data

Feb. 18, 2021    (KR) .......................... 10-2021-0022030

(51) Int. Cl.
| | | |
|---|---|---|
| *H01L 27/32* | (2006.01) | |
| *H01L 51/52* | (2006.01) | |
| *H10K 50/854* | (2023.01) | |
| *H10K 59/12* | (2023.01) | |
| *H10K 59/38* | (2023.01) | |

(52) U.S. Cl.
CPC .......... *H10K 59/38* (2023.02); *H10K 50/854* (2023.02); *H10K 59/12* (2023.02)

(58) Field of Classification Search
None
See application file for complete search history.

(56) References Cited

U.S. PATENT DOCUMENTS

| | | | |
|---|---|---|---|
| 7,616,274 | B2 | 11/2009 | Ho |
| 7,750,984 | B2 | 7/2010 | Ha et al. |
| 2012/0098414 | A1 | 4/2012 | Nakamura |
| 2016/0033814 | A1* | 2/2016 | Na .................... G02F 1/133305 |
| | | | 445/24 |
| 2016/0195774 | A1 | 7/2016 | Lee et al. |
| 2019/0121176 | A1* | 4/2019 | Lee ........................ G02F 1/1336 |
| 2021/0036063 | A1* | 2/2021 | Kim ......................... H10K 59/38 |

FOREIGN PATENT DOCUMENTS

| | | |
|---|---|---|
| KR | 10-0996213 | 11/2010 |
| WO | 2010/150353 | 12/2010 |

* cited by examiner

*Primary Examiner* — Robert K Carpenter
(74) *Attorney, Agent, or Firm* — KILE PARK REED & HOUTTEMAN PLLC

(57) ABSTRACT

A display apparatus includes a light-emitting unit including light-emitting elements, and a color unit disposed on the light-emitting unit and including a first color area, a second color area, and a third color area that overlap the light-emitting elements and emit light beams of different colors. The color unit includes a light-transmission layer including a first opening corresponding to the first color area and a second opening corresponding to the second color area, a first color conversion layer disposed within the first opening of the light-transmission layer, a second color conversion layer disposed within the second opening of the light-transmission layer, and a spacer disposed on the light-transmission layer and between two adjacent color areas among the first color area, the second color area, and the third color area, the spacer including a light shielding material.

20 Claims, 8 Drawing Sheets

DISPLAY APPARATUS

CROSS-REFERENCE TO RELATED APPLICATION(S)

This application claims priority to and benefits of Korean Patent Application No. 10-2021-0022030 under 35 U.S.C. § 119, filed on Feb. 18, 2021 in the Korean Intellectual Property Office, the entire contents of which are incorporated herein by reference.

BACKGROUND

1. Technical Field

One or more embodiments relate to display apparatuses having improved display quality.

2. Description of the Related Art

Display apparatuses visually display data. As various electronic devices such as mobile phones, PDAs, computers, and large-sized TVs have developed, various types of display apparatuses applicable to the electronic devices have been developed. For example, display technologies widely used in the market include a liquid crystal display having a backlight unit, and an organic light-emitting display in which different color regions emit light beams of different colors. Recently, a display apparatus including a quantum dot color conversion layer (QD-CCL) has been developed. Quantum dots may be excited by incident light to emit light having a longer wavelength than the wavelength of the incident light, and light in a low wavelength band may be used as the incident light. Applications of display apparatuses have been diversified, and also various designs have been proposed to improve the quality of display apparatuses.

SUMMARY

One or more embodiments may include a display apparatus having an improved display quality, and a method of manufacturing the display apparatus. However, the one or more embodiments are only examples, and the scope of the disclosure is not limited thereto.

Additional aspects will be set forth in part in the description which follows and, in part, will be apparent from the description, or may be learned by practice of the presented embodiments of the disclosure.

According to one or more embodiments, a display apparatus may include a light-emitting unit including light-emitting elements, and a color unit disposed on the light-emitting unit and including a first color area, a second color area, and a third color area that overlap the light-emitting elements and emit light beams of different colors. The color unit may include a light-transmission layer including a first opening corresponding to the first color area and a second opening corresponding to the second color area, a first color conversion layer disposed within the first opening of the light-transmission layer, a second color conversion layer disposed within the second opening of the light-transmission layer, and a spacer disposed on the light-transmission layer and between two adjacent color areas among the first color area, the second color area, and the third color area, the spacer including a light shielding material.

A length of the spacer in a first direction may be equal to or less than a length of an area where the two adjacent color areas overlap each other in a second direction intersecting the first direction.

A width of the spacer in the second direction may be equal to or less than a separation distance between the two adjacent color areas.

The spacer may be disposed to intersect a virtual line that connects respective centers of two adjacent color areas among the first color area, the second color area, and the third color area in plan view.

The spacer of the color unit may extend to the light-emitting unit.

Each of the light-transmission layer, the first color conversion layer, and the second color conversion layer may include scattering particles. The first color conversion layer and the second color conversion layer may include a first quantum dot and a second quantum dot, respectively, and the first quantum dot and the second quantum dot may include same materials and may have different sizes.

The color unit may further include a first color filter layer corresponding to the first color area, a second color filter layer corresponding to the second color area, and a third color filter layer corresponding to the third color area.

The first color filter layer, the second color filter layer, and the third color filter layer may overlap one another in a light shielding area between two adjacent color areas among the first color area, the second color area, and the third color area in plan view.

The color unit may further include a low refractive layer between the first color filter layer and the first color conversion layer, between the second color filter layer and the second color conversion layer, and between the third color filter layer and the light-transmission layer.

Each of the light-emitting elements may include a pixel electrode, an opposite electrode on the pixel electrode, and an emission layer between the pixel electrode and the opposite electrode.

According to one or more embodiments, a display apparatus may include a first substrate, a first light-emitting element, a second light-emitting element, and a third light-emitting element, which may be disposed on the first substrate, a second substrate disposed on the first substrate such that the first light-emitting element, the second light-emitting element, and the third light-emitting element may be disposed therebetween, a light-transmission layer disposed on a surface of the second substrate that faces the first substrate, the light-transmission layer including a first opening overlapping the first light-emitting element and a second opening overlapping the second light-emitting element, a first color conversion layer disposed within the first opening of the light-transmission layer, a second color conversion layer disposed within the second opening of the light-transmission layer, at least one capping layer covering the light-transmission layer, the first color conversion layer, and the second color conversion layer, and a spacer disposed on the light-transmission layer and disposed between the first and second openings, the spacer including a light shielding material.

The display apparatus may further include a first color filter layer overlapping the first color conversion layer and disposed between the second substrate and the first color conversion layer, a second color filter layer overlapping the second color conversion layer and disposed between the second substrate and the second color conversion layer, and a third color filter layer overlapping at least a portion of the light-transmission layer and disposed between the second substrate and the light-transmission layer.

At least a portion of the first color filter layer, at least a portion of the second color filter layer, and at least a portion of the third color filter layer may overlap each other.

The third color filter layer may include a first hole corresponding to the first color conversion layer, and a second hole corresponding to the second color conversion layer. The second color filter layer may include a third hole corresponding to a portion of the light-transmission layer, and a fourth hole overlapping the first hole and defining the first color area. The first color filter layer may include a fifth hole overlapping the second hole and defining the second color area, and a sixth hole overlapping the third hole and defining the third color area.

The spacer may be disposed between two adjacent color areas among the first color area, the second color area, and the third color area, and a length of the spacer in a first direction may be equal to or less than a length of an area where the two adjacent color areas overlap each other in a second direction intersecting to the first direction.

The spacer may be disposed to intersect a virtual line that connects respective centers of two adjacent color areas among the first color area, the second color area, and the third color area in plan view.

Each of the light-transmission layer, the first color conversion layer, and the second color conversion layer may include scattering particles. The first color conversion layer and the second color conversion layer may include a first quantum dot and a second quantum dot, respectively, and the first quantum dot and the second quantum dot may include same materials and may have different sizes.

Each of the first light-emitting element, the second light-emitting element, and the third light-emitting element may include a pixel electrode, an opposite electrode on the pixel electrode, and an emission layer between the pixel electrode and the opposite electrode.

The display apparatus may further include an encapsulation layer disposed on the first substrate to cover the first light-emitting element, the second light-emitting element, and the third light-emitting element. The spacer may be disposed between the at least one capping layer and the encapsulation layer and may extend to the encapsulation layer.

The display apparatus may further include a low refractive layer between the first color filter layer and the first color conversion layer, between the second color filter layer and the second color conversion layer, and between the third color filter layer and the light-transmission layer.

These and/or other aspects will become apparent and more readily appreciated from the following description of the embodiments, the claims, and the accompanying drawings.

These general and specific embodiments may be implemented by using a system, a method, a computer program, or a combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
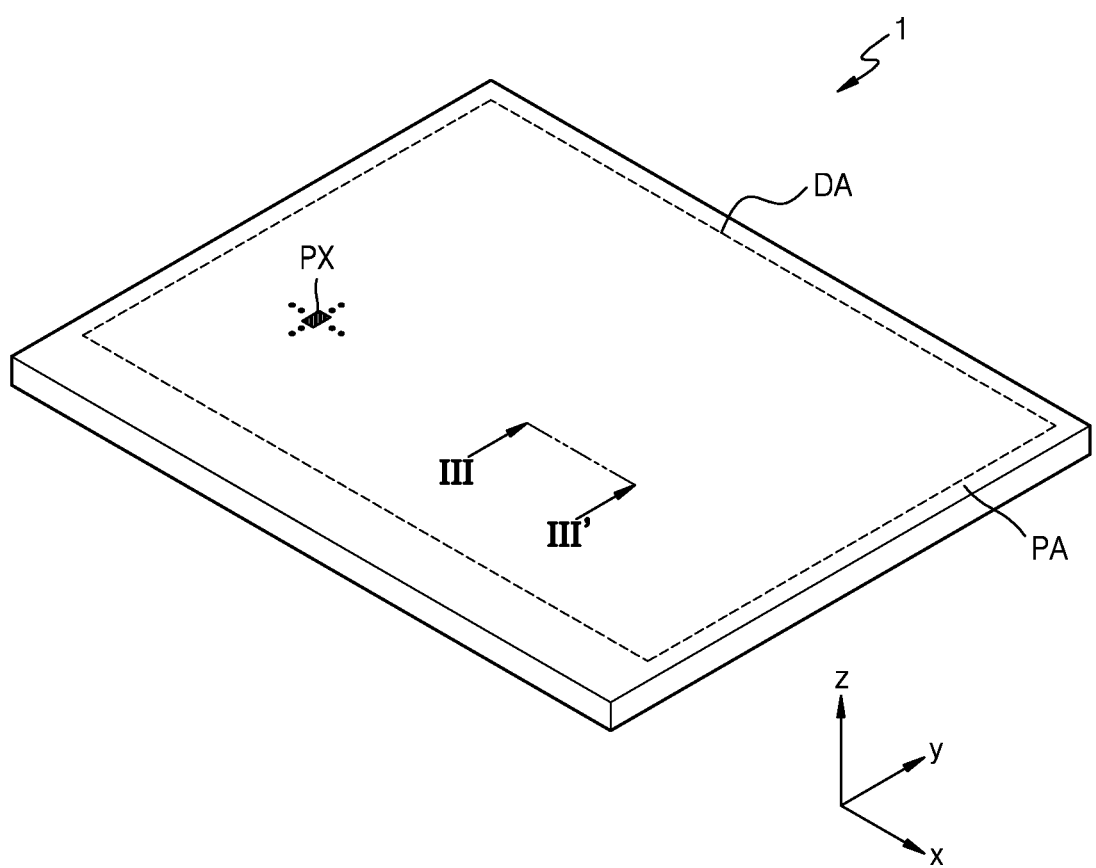
FIG. 1 is a schematic perspective view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description.

Those components that are the same as or are in correspondence with each other are rendered the same reference numeral regardless of the figure number, and redundant explanations are omitted.

It will be understood that although the terms "first," "second," etc. may be used herein to describe various components, these components should not be limited by these terms. These components are only used to distinguish one component from another.

As used herein, the singular forms "a," "an," and "the" are intended to include the plural forms as well (and vice versa), unless the context clearly indicates otherwise.

It will be further understood that terms such as "comprises", "has", "have", and "includes" are used herein to specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. For example, intervening layers, regions, or components may be present.

Sizes of elements in the drawings may be exaggerated for convenience of explanation. In other words, since sizes and thicknesses of components in the drawings may be arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

In the specification, "A and/or B" represents A or B, or A and B. The terms "and" and "or" may be used in the conjunctive or disjunctive sense and may be understood to be equivalent to "and/or." The expression "at least one of A and B" indicates only A, only B, both A and B, or variations thereof.

It will be understood that the terms "connected to" or "coupled to" may include a physical or electrical connection or coupling. It will also be understood that when a layer, region, or component is referred to as being "connected" or "coupled" to another layer, region, or component, it can be directly connected or coupled to the other layer, region, or/and component or intervening layers, regions, or components may be present. For example, when a layer, region, or component is referred to as being "electrically connected" or "electrically coupled" to another layer, region, or component, it can be directly electrically connected or coupled to the other layer, region, and/or component or intervening layers, regions, or components may be present.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that may not be perpendicular to one another.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view of a display apparatus 1 according to an embodiment.

Referring to FIG. 1, the display apparatus 1 may visually display data, and may include a display area DA that emits light and a peripheral area PA that does not emit light. The display apparatus 1 may provide an image by using light emitted in the display area DA.

FIG. 1 illustrates a case where the display area DA of the display apparatus 1 may be rectangular. However, the shape of the display area DA may be an arbitrary shape such as a circle, an oval, or a polygon such as a triangle or a pentagon.

Pixels PX may be arranged in the display area DA, and may be located at a point where scan lines (not shown) extending in an x direction and data lines (not shown) extending in a y direction substantially intersect with each other. Each of the pixels PX may be a region in which light of a certain color may be emitted to the outside, and may be defined as a minimum unit that constitutes the display area DA. In other words, the display apparatus 1 may provide an image by using light emitted by the pixels PX. Herein, each of the pixels PX may refer to each subpixel that may emit light beams of different colors, and may be one of, for example, a red subpixel, a green subpixel, and a blue subpixel.

The peripheral area PA may surround at least a portion of the display area DA. For example, the peripheral area PA may surround the entire display area DA. Various lines for delivering electrical signals or power that may be applied to the display area DA may be located in the peripheral area PA. A portion of a circuit part for controlling an electrical signal that may be applied to the display area DA may be located in the peripheral area PA.

The peripheral area PA may include a pad area (not shown) at one side thereof. A pad part including pads may be located on the pad area. The pads included in the pad part may receive signals through a printed circuit board by being electrically connected to pads of the printed circuit board, respectively. The pads may be exposed without being covered by an insulating layer, and may be electrically connected to the printed circuit board or the like.

According to an embodiment, the display apparatus 1 may include an electronic component located at a side thereof. The electronic component may be an electronic component that uses light or sound. For example, the electronic component may be, for example, a sensor for measuring a distance, such as a proximity sensor, a sensor for sensing a part (e.g., a fingerprint, an iris, or a face) of the body of a user, a small lamp for outputting light, or an image sensor (e.g., a camera) for capturing an image. An electronic component using light may use light in various wavelength bands, such as visible light, infrared light, and ultraviolet light. The electronic component using sound may use sound of ultrasonic waves or other frequency bands. According to some embodiments, the electronic component may include sub-components, like a light emitter and a light receiver. The light emitter and the light receiver may be integrated with each other, or may be physically separated from each other such that a pair of a light emitter and a light receiver may constitute one electronic component.

The display apparatus 1 of FIG. 1 may be used in, for example, mobile phones, TVs, advertisement panels, tablet personal computers (PCs), notebook computers, and smartwatches or smartbands worn on the wrist. FIG. 1 illustrates a case where the display apparatus 1 may be a flat display apparatus, but the display apparatus 1 may be implemented in various other shapes such as a flexible display apparatus, a foldable display apparatus, and a rollable display apparatus.

A case where display apparatus 1 according to an embodiment includes an organic light-emitting display panel will now be illustrated and described. However, display apparatuses 1 according to embodiments are not limited thereto. According to an embodiment, the display apparatus 1 may include an inorganic light-emitting display panel. The inorganic light-emitting display panel may include an inorganic light-emitting diode including a PN diode including materials based on an inorganic material semiconductor. The aforementioned inorganic light-emitting diode may have a size of, for example, several to several hundreds of micrometers. The aforementioned inorganic light-emitting diode may be referred to as a micro LED. As another example, the inorganic light-emitting diode may have a nanometer-unit size. The inorganic light-emitting diode may be referred to as a nano LED. According to another embodiment, the display apparatus 1 may include a quantum dot light-emitting display panel including a quantum dot light-emitting element.

Figure 2:
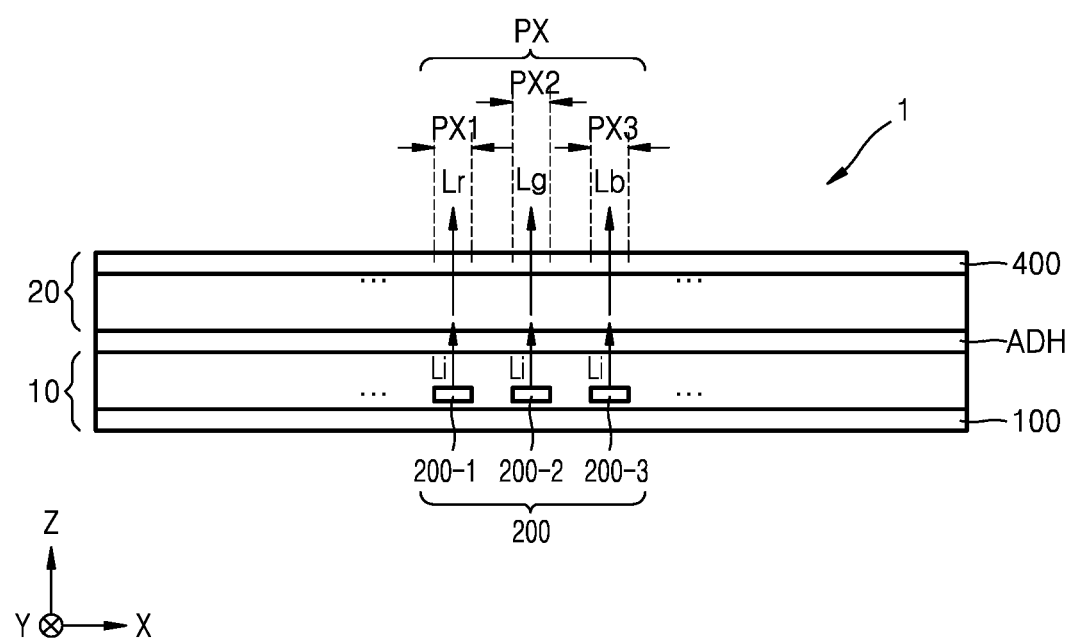
FIG. 2 is a schematic cross-sectional view of a portion of the display apparatus according to an embodiment.

FIG. 2 is a schematic cross-sectional view of a portion of the display apparatus 1 according to an embodiment.

Referring to FIG. 2, the display apparatus 1 may include a light-emitting unit 10 and a color unit 20 stacked on each other in a thickness direction (e.g., a z direction). According to an embodiment, the light-emitting unit 10 and the color unit 20 may be arranged opposite to each other.

The light-emitting unit 10 may include a first substrate 100, and light-emitting elements 200 arranged on the first substrate 100. For example, the light-emitting unit 10 may include a first light-emitting element 200-1, a second light-emitting element 200-2, and a third light-emitting element 200-3. According to an embodiment, the first, second, and third light-emitting elements 200-1, 200-2, and 200-3 may emit light of the same color, for example, blue light. According to another embodiment, the first, second, and third light-emitting elements 200-1, 200-2, and 200-3 may emit light beams of different colors, respectively. For example, the first light-emitting element 200-1 may emit red light, the second light-emitting element 200-2 may emit green light, and the third light-emitting element 200-3 may emit blue light. For convenience of explanation, a case where all of the first, second, and third light-emitting elements 200-1, 200-2, and 200-3 emit blue light will now be described.

Although not shown in the drawings, the light-emitting unit 10 may include, for example, a pixel circuit for driving each light-emitting element 200 and various wires for delivering electrical signals and power to the pixel circuit. The pixel circuit and the various wires may be arranged on the first substrate 100.

Light emitted by the light-emitting unit 10 may be incident as incident light Li toward the color unit 20. The incident light Li may be, for example, blue light. The incident light Li may be converted to various colors while passing through the color unit 20. For example, the blue incident light Li emitted by the first light-emitting element 200-1 and the second light-emitting element 200-2 may be converted to red light Lr and green light Lg, respectively, while passing through the color unit 20, and may be emitted to the outside. The blue incident light Li emitted by the third light-emitting element 200-3 may pass through the color unit 20 without color conversion and may be emitted as the blue light Lb to the outside.

To this end, the color unit 20 may include a color-conversion transmission layer (not shown) that converts the color of light or transmits the light. The color unit 20 may include a color filter layer (not shown) to improve the color purity of color-converted or transmitted light. The color-conversion transmission layer and the color filter layer may be located on (e.g., directly on) a second substrate 400 of the color unit 20. 'Being located directly on the second substrate 400' may refer to manufacturing the color unit 20 by forming the color-conversion transmission layer and the color filter layer directly on the second substrate 400.

According to an embodiment, as shown in FIG. 2, the light-emitting unit 10 and the color unit 20 may be bonded with each other such that the color-conversion transmission layer and the color filter layer of the color unit 20 may face the light-emitting element 200 of the light-emitting unit 10. In other words, the first substrate 100 and the second substrate 400 may be arranged opposite to each other such that the light-emitting element 200, the color-conversion transmission layer, and the color filter layer may be located therebetween.

In FIG. 2, the light-emitting unit 10 and the color unit 20 may be bonded with each other through an adhesive layer ADH. The adhesive layer ADH may be, but is not limited to, an optical clear adhesive (OCA). According to another embodiment, the light-emitting unit 10 and the color unit 20 may be bonded with each other by a filler included in the color unit 20. According to a selective embodiment, the adhesive layer ADH may be omitted.

The red light Lr, the green light Lg, and the blue light Lb may be emitted through pixels PX, respectively. For example, the display apparatus 1 may include a first pixel PX1, a second pixel PX2, and a third pixel PX3, and the display apparatus 1 may emit the red light Lr, the green light Lg, and the blue light Lb through the first pixel PX1, the second pixel PX2, and the third pixel PX3, respectively. The red light Lr may belong to a wavelength band of about 580 nm to about 780 nm, the green light Lg may belong to a wavelength band of about 495 nm to about 580 nm, and the blue light Lb may belong to a wavelength band of about 400 nm to about 495 nm.

Figure 3:
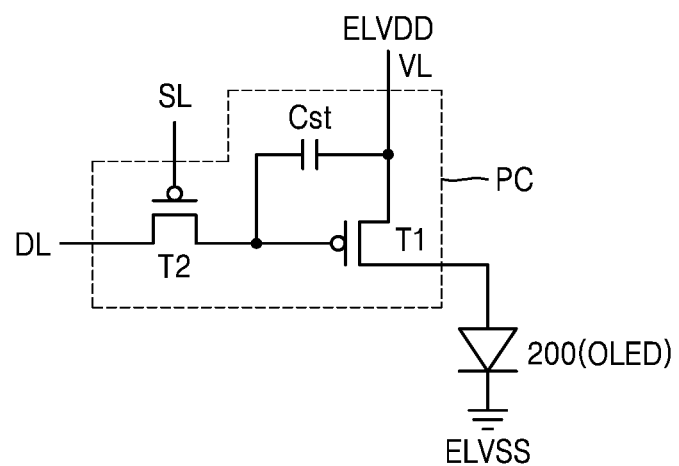
FIG. 3 is an equivalent circuit diagram of a pixel circuit included in a display apparatus according to an embodiment.

FIG. 3 is an equivalent circuit diagram of a pixel circuit PC included in a display apparatus according to an embodiment.

Referring to FIG. 3, a pixel circuit PC may include thin-film transistors and a storage capacitor Cst, and may be electrically connected to the light-emitting element 200, for example, an organic light-emitting diode OLED. According to an embodiment, the pixel circuit PC may include a driving thin-film transistor T1, a switching thin-film transistor T2, and the storage capacitor Cst.

The switching thin-film transistor T2 may be connected to a scan line SL and a data line DL, and may transmit, to the driving thin-film transistor T1, a data signal or data voltage received via the data line DL according to a scan signal or switching voltage received via the scan line SL. The storage capacitor Cst may be connected to the switching thin-film transistor T2 and a driving voltage line VL, and may store a voltage corresponding to a difference between a voltage received from the switching thin-film transistor T2 and a first power supply voltage ELVDD supplied to the driving voltage line VL.

The driving thin-film transistor T1 may be connected to the driving voltage line VL and the storage capacitor Cst, and may control a driving current flowing from the driving voltage line VL to the light-emitting element 200, in accordance with a voltage value stored in the storage capacitor Cst. An opposite electrode (for example, a cathode) of the light-emitting element 200 may receive a second power supply voltage ELVSS. The light-emitting element 200 may emit light having a certain brightness according to the driving current.

Although a case where the pixel circuit PC includes two thin-film transistors and one storage capacitor is illustrated in FIG. 2, embodiments are not limited thereto. For example, the pixel circuit PC may include three or more thin-film transistors and/or two or more storage capacitors. According to an embodiment, the pixel circuit PC may include seven thin-film transistors and one storage capacitor. The number of thin-film transistors and the number of storage capacitors may vary according to a design of the pixel circuit PC. However, a case where the pixel circuit PC includes two thin-film transistors and one storage capacitor will now be described for convenience of explanation.

Figure 4:
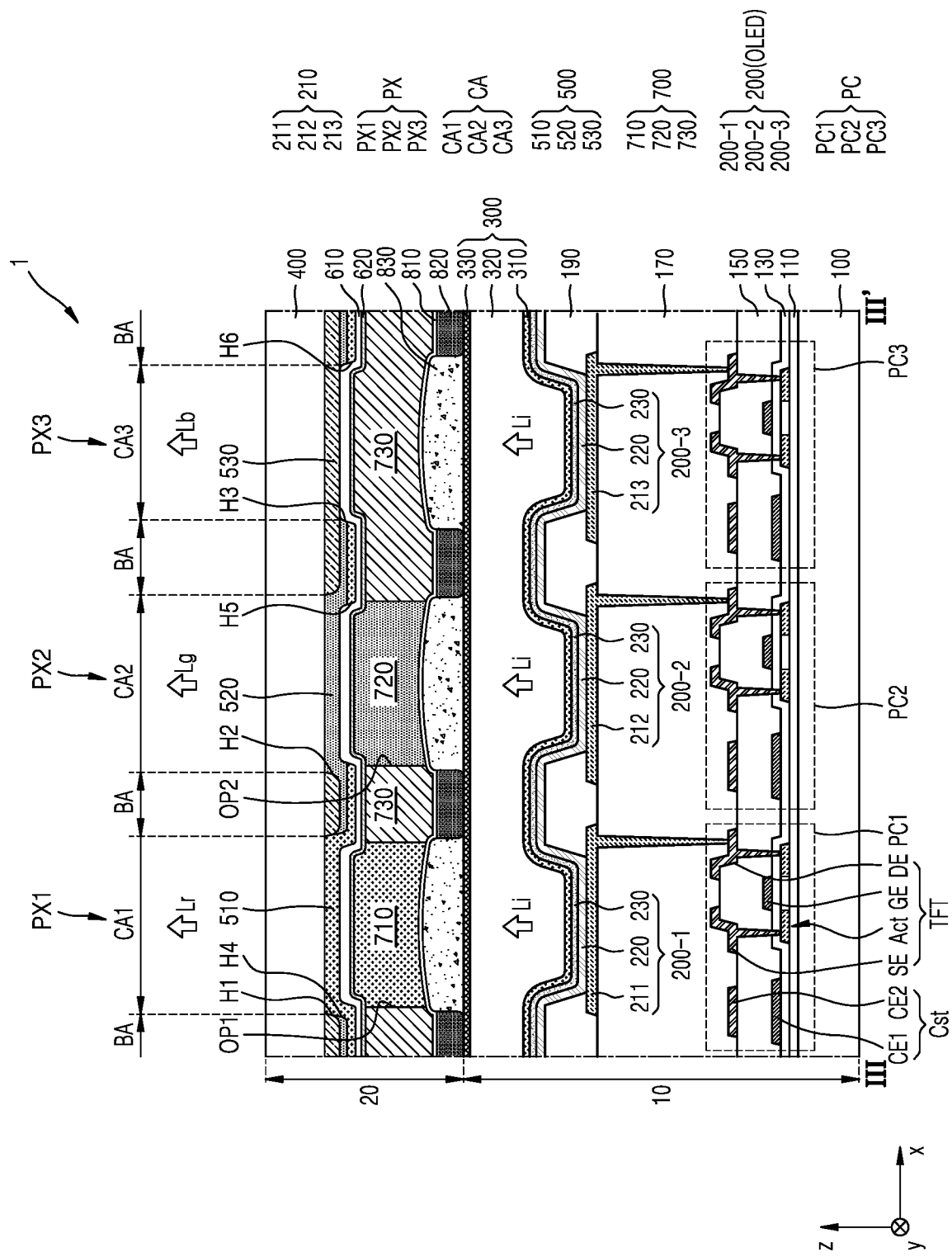
FIG. 4 is a schematic cross-sectional view of a portion of the display apparatus of FIG. 1.

FIG. 4 is a schematic cross-sectional view of a portion of the display apparatus 1 of FIG. 1, and may correspond to a cross-section of the display apparatus 1 taken along line III-III' of FIG. 1.

Referring to FIG. 4, the display apparatus 1 may include the light-emitting unit 10 and the color unit 20 arranged on the light-emitting unit 10.

The light-emitting unit 10 may include the first substrate 100. The first substrate 100 may include glass, metal, polymer resin, or a combination thereof. For example, the first substrate 100 may include polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. In case that the first substrate 100 includes the aforementioned polymer resin, the first substrate 100 may have flexible, rollable, or bendable characteristics. For example, the first substrate 100 may have a multi-layered structure including two layers each including such a polymer resin and a barrier layer including an inorganic material between the two layers. For example, the barrier layer may include an inorganic material, such as silicon oxide, silicon nitride, and/or silicon oxynitride.

The light-emitting unit 10 may further include light-emitting elements 200 arranged on the first substrate 100. As shown in FIG. 4, the light-emitting elements 200 may include a first light-emitting element 200-1, a second light-emitting element 200-2, and a third light-emitting element 200-3.

The light-emitting unit 10 may further include pixel circuits PC arranged on the first substrate 100 and electrically connected to the light-emitting elements 200, respectively. The pixel circuits PC may be between the first substrate 100 and the light-emitting elements 200. Each of the pixel circuits PC may include thin-film transistors TFT and a storage capacitor Cst. FIG. 4 illustrates a first pixel circuit PC1, a second pixel circuit PC2, and a third pixel circuit PC3 electrically connected to the first, second, and third light-emitting elements 200-1, 200-2, and 200-3, respectively, and illustrates respective cross-sections of one thin-film transistor TFT and one storage capacitor Cst that may both be included in each of the first, second, and third pixel circuits PC1, PC2, and PC3.

A stack structure of a pixel circuit PC and a light-emitting element 200 arranged on the first substrate 100 will now be described in detail.

The thin-film transistor TFT of the pixel circuit PC may include a semiconductor layer Act, a gate electrode GE overlapping a channel region of the semiconductor layer Act, and a source electrode SE and a drain electrode DE respectively connected to a source region and a drain region of the semiconductor layer Act.

The semiconductor layer Act may include polysilicon. According to an embodiment, the semiconductor layer Act may include amorphous silicon. According to an embodiment, the semiconductor layer Act may include oxide of at least one selected from the group of indium (In), gallium (Ga), tin (Sn), zirconium (Zr), vanadium (V), hafnium (Hf), cadmium (Cd), germanium (Ge), chromium (Cr), titanium (Ti), and zinc (Zn). The semiconductor layer Act may include a channel region, and a source region and a drain region doped with impurities.

The gate electrode GE may include a low-resistance conductive material such as molybdenum (Mo), aluminum (Al), copper (Cu), and/or titanium (Ti), and may have a multi-layer or single layer structure including the aforementioned materials.

The source electrode SE or the drain electrode DE may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may have a single layer or multi-layer structure including the aforementioned materials. According to an embodiment, the source electrode SE or the drain electrode DE may further include a material such as indium tin oxide (ITO) on a layer including the aforementioned metal. For example, the source electrode SE or the drain electrode DE may be variously changed, such as having a stacked structure of a titanium layer/aluminum layer/titanium layer or a stacked structure of a titanium layer/copper layer/ITO layer.

The storage capacitor Cst may include a first capacitor plate CE1 and a second capacitor plate CE2 overlapping each other. The first capacitor plate CE1 may be arranged on the same layer as the layer on which the gate electrode GE may be arranged, and may include the same material as the material included in the gate electrode GE. The second capacitor plate CE2 may be arranged on the same layer as the layer on which the source electrode SE or the drain electrode DE may be arranged, and may include the same material as the material included in the source electrode SE or the drain electrode DE. An insulating layer (for example, an interlayer insulating layer 150) may be between the first capacitor plate CE1 and the second capacitor plate CE2 of the storage capacitor Cst, and the first capacitor plate CE1 and the second capacitor plate CE2 may be arranged to overlap each other to form a capacitor. The insulating layer (for example, an interlayer insulating layer 150) may function as a dielectric layer of the storage capacitor Cst.

FIG. 4 illustrates that the gate electrode GE of the thin-film transistor TFT and the first capacitor plate CE1 of the storage capacitor Cst may be separately arranged. However, in some embodiments, the storage capacitor Cst may overlap the thin-film transistor TFT. The gate electrode GE of the thin-film transistor TFT may function as the first capacitor plate CE1 of the storage capacitor Cst.

A buffer layer 110 may be between the first substrate 100 and the semiconductor layer Act. The buffer layer 110 may reduce or prevent infiltration of a foreign material, moisture, or ambient air from below the first substrate 100 and may provide a flat surface to the first substrate 100. The buffer layer 110 may include an inorganic insulating material, such as silicon oxide, silicon oxynitride, and/or silicon nitride, and may be a single layer or multiple layers including the inorganic insulating material.

To secure insulation between the semiconductor layer Act and the gate electrode GE, a gate insulating layer 130 may be between the semiconductor layer Act and the gate electrode GE. The gate insulating layer 130 may include an inorganic material, such as silicon oxide, silicon nitride, and/or silicon oxynitride.

An interlayer insulating layer 150 may be on the gate electrode GE and the first capacitor plate CE1 and may include an inorganic material, such as silicon oxide, silicon nitride, and/or silicon oxynitride, and the source electrode SE, the drain electrode DE, and the second capacitor plate CE2 may be on the interlayer insulating layer 150. An insulating layer including such an inorganic material may be formed via chemical vapor deposition (CVD) or atomic layer deposition (ALD).

A planarization layer 170 may be on the thin-film transistor TFT. For example, in case that the light-emitting element 200 is disposed over the thin-film transistor TFT as illustrated in FIG. 4, the planarization layer 170 may provide a flat upper surface to the light-emitting element 200. The planarization layer 170 may be formed of an organic material, such as, benzocyclobutene (BCB) or hexamethyldisiloxane (HMIDSO). Although the planarization layer 170 may be a single layer in FIG. 4, various modifications may be made to the planarization layer 170. For example, the planarization layer 170 may be a stack of multiple layers.

The light-emitting elements 200 may be on the planarization layer 170. Each of the light-emitting elements 200 may include a pixel electrode 210, an opposite electrode 230 on the pixel electrode 210, and an intermediate layer 220 between the pixel electrode 210 and the opposite electrode 230 and including an emission layer. For example, the first light-emitting element 200-1 may have a stack structure including a first pixel electrode 211, an intermediate layer 220, and an opposite electrode 230, the second light-emitting element 200-2 may have a stack structure including a second pixel electrode 212, an intermediate layer 220, and an opposite electrode 230, and the third light-emitting element 200-3 may have a stack structure including a third pixel electrode 213, an intermediate layer 220, and an opposite electrode 230.

The pixel electrodes 210 may each contact one of the source electrode SE and the drain electrode DE through a contact hole formed in, for example, the planarization layer 170, and may be electrically connected to the respective thin-film transistors TFT of the first through third pixel circuits PC1, PC2, and PC3. Each of the pixel electrodes 210 may include a light-transmissive conductive layer formed of a light-transmissive conductive oxide such as ITO, $In_2O_3$, and/or IZO, and a metal layer formed of a metal such as Al or Ag. For example, the pixel electrode 210 may have a three-layered structure of ITO/Ag/ITO.

An upper insulating layer 190 may be located on the planarization layer 170. The upper insulating layer 190 may have an opening via which a center portion of each of the pixel electrodes 210 may be exposed. The upper insulating layer 190 may prevent an arc or the like from occurring between the edge of each of the pixel electrodes 210 and the opposite electrode 230, by increasing a distance between the edge of each of the pixel electrodes 210 and the opposite electrode 230. The upper insulating layer 190 may be formed of an organic material, for example, polyimide or HMIDSO.

The intermediate layer 220 may include an emission layer and may be located on each of the pixel electrodes 210. The emission layer may emit light of a certain color. The emission layer may emit blue light having a center wavelength of, for example, about 450 nm to about 495 nm (hereinafter, referred to as light of a third color).

The intermediate layer 220 may include a low-molecular weight or high-molecular weight material. In case that the intermediate layer 220 includes a low-molecular weight material, the intermediate layer 220 may have a single- or multi-layered stack structure including at least one of a hole injection layer (HIL), a hole transport layer (HTL), an emission layer (EML), an electron transport layer (ETL) and an electron injection layer (EIL), and may be formed via vacuum deposition. In case that the intermediate layer 220 includes a high-molecular weight material, the intermediate layer 220 may have a structure including an HTL and an EML. The HTL may include poly(ethylenedioxythiophene) (PEDOT), and the emission layer may include a high-molecular weight material such as a polyphenylene vinylene (PPV)-based material or a polyfluorene-based material. The intermediate layer 220 may be formed via screen printing, inkjet printing, deposition, laser induced thermal imaging (LITI), or the like. The intermediate layer 220 is not limited thereto, and may have any of various other structures.

According to an embodiment, the intermediate layer 220 may be integrally formed to cover the pixel electrodes 210. For example, the intermediate layer 220 may correspond to all of the first, second, and third pixel electrodes 211, 212, and 213. According to an embodiment, the emission layer and the aforementioned functional layers, for example, a hole injection layer (HIL), a hole transport layer (HTL), an electron transport layer (ETL), and/or an electron injection layer (EIL), may be integrally formed on the first substrate 100.

The opposite electrode 230 may be located on the intermediate layer 220. The opposite electrode 230 may be integrally formed over the pixel electrodes 210. For example, the opposite electrode 230 may correspond to all of the first through third pixel electrodes 211, 212, and 213. The opposite electrode 230 may include a light-transmissive conductive layer formed of ITO, $In_2O_3$, and/or IZO, and a (semi)transparent layer including silver (Ag), magnesium (Mg), aluminum (Al), nickel (Ni), chromium (Cr), lithium (Li), calcium (Ca), and/or an alloy of these materials. For example, the opposite electrode 230 may be a semi-transmissive layer including Ag, Mg, or a combination thereof.

Because the light-emitting elements 200 may be easily damaged by external moisture, oxygen, or the like, an encapsulation layer 300 may cover and protect the light-emitting elements 200. For example, the encapsulation layer 300 may be arranged on the first substrate 100 to cover the first through third light-emitting elements 200-1, 200-2, and 200-3. In other words, the encapsulation layer 300 may be located on the opposite electrode 230.

According to an embodiment, the encapsulation layer 300 may include first and second inorganic encapsulation layers 310 and 330 and an organic encapsulation layer 320 therebetween. Each of the first and second inorganic encapsulation layer 310 and 330 may include one or more inorganic insulative materials. The inorganic insulative materials may include, for example, aluminum oxide, titanium oxide, tantalum oxide, hafnium oxide, zinc oxide, silicon oxide, silicon nitride, and/or silicon oxynitride. The first and second inorganic encapsulation layers 310 and 330 may be formed by chemical vapor deposition.

The organic encapsulation layer 320 may include a polymer-based material. Examples of the polymer-based material may include an acrylic resin, an epoxy-based resin, polyimide, polyethylene, or a combination thereof. For example, the organic encapsulation layer 320 may include an acrylic resin, for example, polymethyl methacrylate or polyacrylic acid. The organic encapsulation layer 320 may be formed by curing a monomer or by coating a polymer.

The structure stacked from the first substrate 100 to the encapsulation layer 300 may be referred to as the light-emitting unit 10.

Light emitted by the light-emitting unit 10 may be incident light Li incident upon the color unit 20. For example, the light emitted by each of the first through third light-emitting elements 200-1, 200-2, and 200-3 may travel as the incident light Li toward the color unit 20. Some of the incident light beams Li may be color-converted while passing through the color unit 20 and may be emitted to the outside, and the others of the incident light beams Li may pass through the color unit 20 without color conversion and may be emitted to the outside.

For example, blue incident light Li emitted by the first light-emitting element 200-1 may be converted to red light Lr while passing through the color unit 20, and may be emitted to the outside through a first color area CA1. Blue incident light Li emitted by the second light-emitting element 200-2 may be converted to green light Lg while passing through the color unit 20, and may be emitted to the outside through a second color area CA2. Blue incident light Li emitted by the third light-emitting element 200-3 may pass through the color unit 20 without color conversion, and may be emitted to the outside through a third color area CA3. As such, the color unit 20 may include the first color area CA1, the second color area CA2, and the third color area CA3 overlapping the plurality of light-emitting elements 200, respectively, and emitting light beams of different colors. The first color area CA1, the second color area CA2, and the third color area CA3 of the color unit 20 may correspond to the first pixel PX1, the second pixel PX2, and the third pixel PX3 of the display apparatus 1, respectively. The expression 'corresponding to' may refer to overlapping as viewed in a direction (e.g., a +z-axis direction) perpendicular to one surface of the second substrate 400.

The color unit 20 may include a barrier area BA located between two color areas CA from among the first through third color areas CA1 through CA3. In the barrier area BA, light may not be emitted from the color unit 20. Through the barrier area BA, light beams of different colors respectively emitted by two adjacent color areas CA may be prevented or minimized from being mixed.

A stack structure of the color unit 20 will now be described in detail.

According to an embodiment, the color unit 20 may include the second substrate 400, a color filter layer 500, a color-conversion transmission layer 700, a low refractive layer 610, one or more capping layers 620 and 810, a spacer 820, and a filler 830. The color-conversion transmission layer 700 may include a first color conversion layer 710, a second color conversion layer 720, and a light-transmission layer 730.

The second substrate 400 of the color unit 20 may be arranged on the first substrate 100 such that the light-emitting elements 200 of the light-emitting unit 10 may be between the first and second substrates 100 and 400. In other words, the second substrate 400 may be arranged on the first substrate 100 such that the first through third light-emitting elements 200-1, 200-2, and 200-3 may be between the first and second substrates 100 and 400.

According to an embodiment, the second substrate 400 may include glass, metal, polymer resin, or a combination thereof. For example, the second substrate 400 may include polymer resin such as polyethersulfone, polyacrylate, polyetherimide, polyethylene naphthalate, polyethylene terephthalate, polyphenylene sulfide, polyarylate, polyimide, polycarbonate, cellulose acetate propionate, or a combination thereof. In case that the second substrate 400 includes the aforementioned polymer resin, the second substrate 400 may have flexible or bendable characteristics. For example, the second substrate 400 may have a multi-layered structure including two layers each including such a polymer resin and a barrier layer including an inorganic material between the two layers. For example, the barrier layer may include an inorganic material, such as silicon oxide, silicon nitride, and/or silicon oxynitride. According to an embodiment, the second substrate 400 may include the same material as that included in the first substrate 100.

The color filter layer 500 may be located on the second substrate 400. The expression 'a first component being arranged on a second component' may refer to the first component being arranged on a surface of the second component, and 'a surface of the second component' may be not only an upper surface of the second component but also a lower surface or lateral surface of the second component. For example, the color filter layer 500 may be arranged on a surface (for example, a surface directed to a −z direction in FIG. 4) of the second substrate 400 directed to the first substrate 100.

According to an embodiment, the color filter layer 500 may include a first color filter layer 510, a second color filter layer 520, and a third color filter layer 530 selectively transmitting light beams of different colors. For example, the first color filter layer 510 may include a pigment or dye of a first color, and may selectively transmit light of the first color. The light of the first color may be red light Lr belonging to a wavelength band of, for example, about 580 nm to about 780 nm. The second color filter layer 520 may include a pigment or dye of a second color, and may selectively transmit light of the second color. The light of the second color may be green light Lg belonging to a wavelength band of, for example, about 495 nm to about 580 nm. The third color filter layer 530 may include a pigment or dye of a third color, and may selectively transmit light of the third color. The light of the third color may be blue light Lb belonging to a wavelength band of, for example, about 400 nm to about 495 nm.

According to an embodiment, the third color filter layer 530 may include a first hole H1 corresponding to the first color conversion layer 710, and a second hole H2 corresponding to the second color conversion layer 720. The second color filter layer 520 may include a third hole H3 corresponding to a portion of the light-transmission layer 730, and a fourth hole H4 overlapping the first hole H1. The first color filter layer 510 may include a fifth hole H5 overlapping the second hole H2, and a sixth hole H6 overlapping the third hole H3.

Only the first color filter layer 510 may be arranged in an area where the first hole H1 of the third color filter layer 530 and the fourth hole H4 of the second color filter layer 520 overlap each other, and accordingly only the light of the first color may be selectively transmitted. Thus, the area where the first hole H1 and the fourth hole H4 overlap each other may define the first color area CA1. Similarly, only the second color filter layer 520 may be arranged in an area where the second hole H2 of the third color filter layer 530 and the fifth hole H5 of the first color filter layer 510 overlap each other, and accordingly only the light of the second color may be selectively transmitted. Thus, the area where the second hole H2 and the fifth hole H5 overlap each other may define the second color area CA2. Lastly, only the third color filter layer 530 may be arranged in an area where the third hole H3 of the second color filter layer 520 and the sixth hole H6 of the first color filter layer 510 overlap each other, and accordingly only the light of the third color may be selectively transmitted. Thus, the area where the third hole H3 and the sixth hole H6 overlap each other may define the third color area CA3. The first color filter layer 510, the second color filter layer 520, and the third color filter layer 530 may correspond to the first color area CA1, the second color area CA2, and the third color area CA3, respectively.

According to an embodiment, at least a portion of the first color filter layer 510, at least a portion of the second color filter layer 520, and at least a portion of the third color filter layer 530 may overlap each other and form a barrier part, and an area where the barrier part may be arranged may be defined as the barrier area BA. For example, the first through third color filter layers 510, 520, and 530 may overlap one another between two adjacent color areas CA from among the first through third color areas CA1 through CA3 in a planar view. An overlapping portion of the first through third color filter layers 510, 520, and 530 may not transmit any color of visible light. As such, respective portions of the first through third color filter layers 510, 520, and 530 may overlap one another and form the barrier area BA. Thus, even in case that no separate light-shielding members are arranged, a mixture of light beams of different colors respectively emitted by the two adjacent color areas CA may be prevented or reduced.

The first through third color filter layers 510, 520, and 530 may reduce reflection of external light in the display apparatus 1. For example, in case that external light reaches the first color filter layer 510, only light in a specific wavelength band as described above may be transmitted by the first color filter layer 510, and light in the other wavelength bands may be absorbed by the first color filter layer 510. Accordingly, only light in the specific wavelength band from among external light incident upon the display apparatus 1 may be transmitted by the first color filter layer 510, and a portion of the transmitted light may be reflected by the opposite electrode 230 or the first pixel electrode 211 below the first color filter layer 510 and may be emitted back to the outside. Consequently, only a portion of external light incident upon the first color area CA1 may be reflected toward the outside, thereby reducing reflection of external light. This description is equally applicable to the second color filter layer 520 and the third color filter layer 530.

According to an embodiment, the color-conversion transmission layer 700 including the first color conversion layer 710, the second color conversion layer 720, and the light-transmission layer 730 may be arranged on the color filter layer 500. In other words, the color-conversion transmission layer 700 may be arranged on a surface of the second substrate 400 directed to the first substrate 100, and the color filter layer 500 may be between the second substrate 400 and the color-conversion transmission layer 700. For example, the first color filter layer 510 may be between the second substrate 400 and the first color conversion layer 710, the second color filter layer 520 may be between the second substrate 400 and the second color conversion layer 720, and the third color filter layer 530 may be between the second substrate 400 and the light-transmission layer 730.

According to an embodiment, the light-transmission layer 730 may include a first opening OP1 corresponding to the first color area CA1, and a second opening OP2 corresponding to the second color area CA2. The first color conversion layer 710 may be arranged within the first opening OP1 of the light-transmission layer 730, and the second color conversion layer 720 may be arranged within the second opening OP2 of the light-transmission layer 730. In other words, the first color conversion layer 710 may correspond to the first color area CA1, and may overlap the first color filter layer 510 and the first light-emitting element 200-1. The second color conversion layer 720 may correspond to the second color area CA2, and may overlap the second color filter layer 520 and the second light-emitting element 200-2. At least a portion of the light-transmission layer 730 may correspond to the third color area CA3. A portion of the light-transmission layer 730 that corresponds to the third color area CA3 may overlap the third color filter layer 530 and the third light-emitting element 200-3.

The first color conversion layer 710, the second color conversion layer 720, and the light-transmission layer 730 may convert the incident light Li generated by the light-emitting unit 10 to light of a different color or may transmit the incident light Li without color conversion, and may emit the light of a different color or the incident light Li to the first through third color filter layers 510, 520, and 530. Light color-converted by each of the first color conversion layer 710 and the second color conversion layer 720, and light transmitted through the light-transmission layer 730 without color conversion may be one of the red light, the green light, and the blue light. According to an embodiment, the incident light Li may be blue light having a wavelength band that may be equal to or greater than about 400 nm and less than about 495 nm.

Accordingly, the blue incident light Li emitted by the light-emitting unit 10 may be converted into red light while passing through the first color conversion layer 710, converted into green light while passing through the second color conversion layer 720, or transmitted as blue light without color conversion while passing through the light-transmission layer 730. The green light, the red light, and the blue light may be improved in color purity while passing through the first through third color filter layers 510, 520, and 530, respectively, and may be emitted to the outside of the display apparatus 1 to provide a full color image.

According to an embodiment, the light-transmission layer 730 may be formed via patterning by using a photolithography process, and the first color conversion layer 710 and the second color conversion layer 720 may be formed using an inkjet printing process. For example, the light-transmission layer 730 including the first opening OP1 and the second opening OP2 may be first formed, and the first color conversion layer 710 and the second color conversion layer 720 may be formed by spraying inks for forming the first color conversion layer 710 and the second color conversion layer 720, respectively, into the first opening OP1 and the second opening OP2 of the light-transmission layer 730.

As such, according to an embodiment, a portion of the light-transmission layer 730 may be arranged between the first color conversion layer 710 and the second color conversion layer 720 and may function as a partition wall, and thus there may be no need to form a separate partition wall that defines the first color conversion layer 710 and the second color conversion layer 720.

As described above, according to an embodiment, occurrence of a failure in the third pixel PX3 emitting the blue light may be minimized. A case of forming a separate partition wall including openings and forming the first color conversion layer 710, the second color conversion layer 720, or the light-transmission layer 730 in each of the openings through an inkjet printing process may be considered as a comparative example. In the comparative example, because the light-transmission layer 730 needs to be formed separately within a specific opening (i.e., an opening corresponding to a third color area CA3) via inkjet printing, a defect possibility due to a process error or the like may be relatively high, and this may lead to a defect of a blue pixel. In particular, in case that the light-transmission layer 730 includes scattering particles, which will be described later, at a high concentration, the possibility of occurrence of a process defect of inkjet printing may be increased. However, in an embodiment, because a process of forming the light-transmission layer 730 in a specific opening may not be necessary, the possibility of a defect of the above-described blue pixel (i.e., a third pixel) may be reduced.

According to an embodiment, the low refractive layer 610 may be between the color filter layer 500 and the color-conversion transmission layer 700. In other words, the low refractive layer 610 may be located between the first color filter layer 510 and the first color conversion layer 710, between the second color filter layer 520 and the second color conversion layer 720, and between the third color filter layer 530 and the light-transmission layer 730. The low refractive layer 610 may correspond to, for example, the first through third color areas CA1 through CA3. The low refractive layer 610 may include an organic material or may include a mixture of an organic material and an inorganic material.

The low refractive layer 610 may have a relatively low refractive index compared with the first color conversion layer 710, the second color conversion layer 720, and the light-transmission layer 730, and thus may prevent light directed from the color-conversion transmission layer 700 to the low refractive layer 610 from being reflected back to the color-conversion transmission layer 700. Accordingly, the light efficiency of the color unit 20 may be improved. The refractive index used herein may refer to an absolute refractive index representing a ratio between the speed of light in vacuum and the speed of light in a medium.

According to an embodiment, the one or more capping layers 620 and 810 may be included to cover the first color conversion layer 710, the second color conversion layer 720, and the light-transmission layer 730. According to an embodiment, a first capping layer 620 may be arranged on respective surfaces (for example, surfaces directed to the +z direction) of the first color conversion layer 710, the second color conversion layer 720, and the light-transmission layer 730 so as to cover the respective one surfaces. The first capping layer 620 may be understood as being between the color-conversion transmission layer 700 and the color filter layer 500. A second capping layer 810 may be arranged on respective other surfaces (for example, surfaces directed to the −z direction) of the first color conversion layer 710, the second color conversion layer 720, and the light-transmission layer 730 so as to cover the respective other surfaces. The second capping layer 810 may be understood as being between the color-conversion transmission layer 700 and the light-emitting unit 10.

The first and second capping layers 620 and 810 may each include an inorganic insulating material, such as silicon nitride, silicon oxide, and/or silicon oxynitride. The first and second color conversion layers 710 and 720 may each include quantum dots as will be described later, with reference to FIG. 5. Because the quantum dots include nano particles, the quantum dots may react with moisture, oxygen, or the like and may be degraded. Accordingly, the first and second capping layers 620 and 810 may cover the first and second color conversion layers 710 and 720 by being located above and below the first and second color conversion layers 710 and 720, respectively, such that moisture, oxygen, or the like may not flow into the quantum dots within the first and second color conversion layers 710 and 720.

According to an embodiment, the spacer 820 may be on the light-transmission layer 730. In case that the second capping layer 810 is arranged on the light-transmission layer 730, the spacer 820 may be arranged on the second capping layer 810. The spacer 820 may maintain an interval between the light-emitting unit 10 and the color unit 20. To this end, the spacer 820 may contact the light-emitting unit 10. For example, the spacer 820 may be located between the second capping layer 810 and the encapsulation layer 300 of the light-emitting unit 10, and may contact a surface of the encapsulation layer 300.

According to an embodiment, the spacer 820 may be located between two adjacent color areas CA from among the first through third color areas CA1 through CA3 in a planar view. FIG. 4 illustrates that spacers 820 may be arranged between the first color area CA1 and the second color area CA2, between the second color area CA2 and the third color area CA3, and between the third color area CA3 and the first color area CA1, respectively. However, this is merely an example, and the disclosure is not limited thereto. In other words, for example, the spacer 820 may be located between the first color area CA1 and the second color area CA2, and/or the spacer 820 may be located between the second color area CA2 and the third color area CA3, and the spacer 820 may be located between the third color area CA3 and the first color area CA1. Because the barrier area BA may be located between the two adjacent color areas CA, the spacer 820 may be arranged in the barrier area BA.

Because the first color area CA1 may overlap the first opening OP1 of the light-transmission layer 730 and the second color area CA2 may overlap the second opening OP2 of the light-transmission layer 730, the spacer 820 according to an embodiment may be understood as being located between the first opening OP1 and the second opening OP2 in a planar view.

Although one first color area CA1, one second color area CA2, and one third color area CA3 are illustrated in FIG. 4, the first through third color areas CA1 through CA3 may be repeatedly arranged, and the third color area CA3 may be adjacent to another first color area (not shown). Accordingly, the spacer 820 may also be arranged between the third color area CA3 and a first color area (not shown) adjacent thereto.

According to an embodiment, the spacer 820 may include a light-shielding material. For example, the light shielding material of the spacer 820 may include an opaque inorganic insulating material including a metal oxide such as titanium oxide ($TiO_2$), chromium oxide ($Cr_2O_3$), and/or molybdenum oxide ($MoO_3$), or an opaque organic insulating material such as black resin. As another example, the spacer 820 may include a pigment or dye of a black color or the like.

Such a spacer 820 may prevent or minimize color mixing between adjacent pixels PX that emit light beams of different colors. In other words, the spacer 820 including the light shielding material may be arranged between two adjacent color areas CA to prevent color mixing between the light beams of different colors respectively emitted by the adjacent pixels PX.

A display apparatus not including the spacer 820 may be considered as a comparative example. In case that only the second light-emitting element 200-2 is driven, the incident light Li emitted by the second light-emitting element 200-2 mostly travels in the +z direction and may be emitted as the green light Lg through the second color area CA2. However, a portion of the incident light Li may travel in a direction oblique to the +z direction, and, because the light-transmission layer 730 may serve as a partition wall without separate partition walls, the portion of the incident light Li may not be blocked. Consequently, the portion of the incident light Li may be emitted as the red light Lr or the blue light Lb through the first color area CA1 or the third color area CA3, and thus the green light Lg of the second pixel PX2 may be color-mixed with the red light Lr of the first pixel PX1 adjacent to the second pixel PX2 and/or the blue light Lb of the third pixel PX3 adjacent to the second pixel PX2.

However, according to an embodiment, the spacer 820 including the light shielding material may be arranged between two adjacent color areas CA, and thus color mixing between adjacent pixels PX may be prevented or effectively reduced. Accordingly, a display apparatus 1 with an improved color matching rate or a color reproduction rate and an improved display quality may be provided.

Furthermore, as the spacer 820 including the light shielding material may be arranged on the color-conversion transmission layer 700, the spacer 820 may be located relatively close to the light-emitting elements 200, and a shielding effect of the incident light Li due to the spacer 820 may be further increased. This may further improve a color mixing prevention effect.

According to an embodiment, the filler 830 may be on the color-conversion transmission layer 700. In case that the second capping layer 810 is included, the filler 830 may be arranged on the second capping layer 810. The filler 830 may be located between the color-conversion transmission layer 700 and the encapsulation layer 300 of the light-emitting unit 10.

The filler 830 may function as a buffer against external pressure, etc. According to an embodiment, the filler 830 may provide a flat surface and an adhesive strength to achieve adhesion between the color unit 20 and the light-emitting unit 10. The filler 830 may include an organic material such as methyl silicone, phenyl silicone, and/or polyimide. In other embodiments, the filler 830 may include an organic sealant such as a urethane-based resin, an epoxy-based resin, or an acrylic resin, or an inorganic sealant such as silicon, or a combination thereof.

Figure 5:
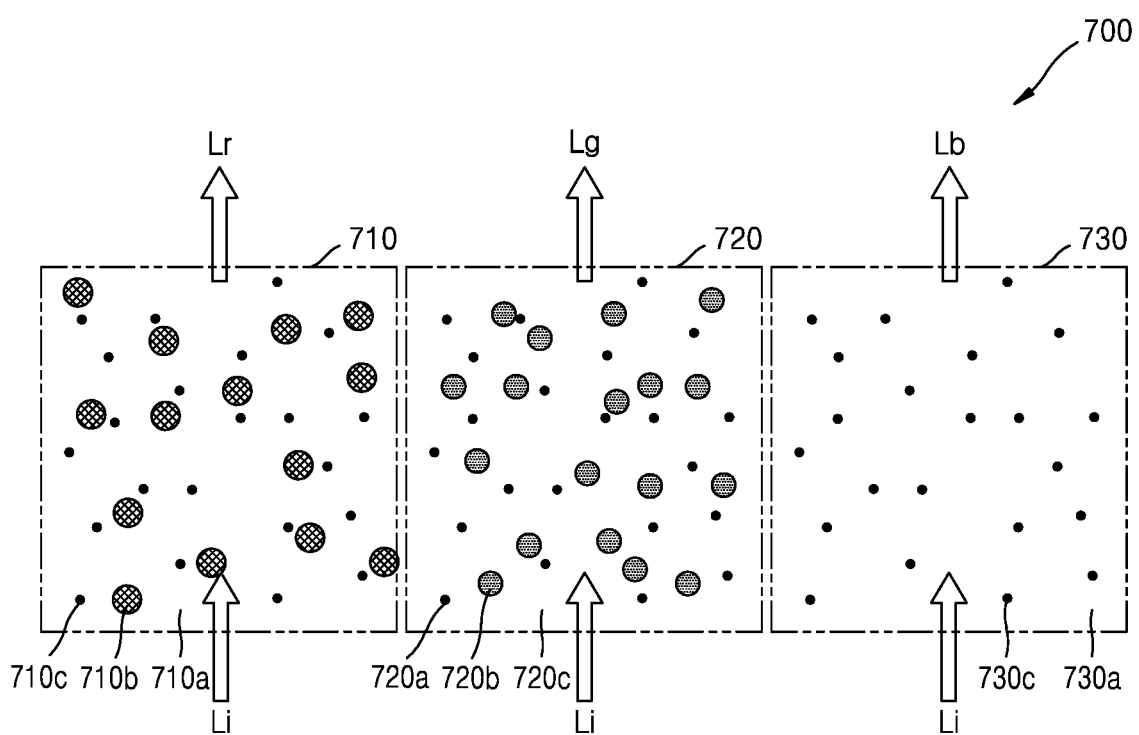
FIG. 5 is a schematic cross-sectional view of a color-conversion transmission layer of a display apparatus according to an embodiment.

FIG. 5 is a schematic cross-sectional view of the color-conversion transmission layer 700 of the display apparatus 1 according to an embodiment.

Referring to FIG. 5, the color-conversion transmission layer 700 may include the first color conversion layer 710, the second color conversion layer 720, and the light-transmission layer 730. The first color conversion layer 710, the second color conversion layer 720, and the light-transmission layer 730 may include first, second, and third scattering particles 710c, 720c, and 730c, respectively, and the first color conversion layer 710 and the second color conversion layer 720 may further include first quantum dots 710b and second quantum dots 720b, respectively.

For example, the first color conversion layer 710 may convert the blue incident light Li to the red light Lr. To this end, the first color conversion layer 710 may include a first photosensitive polymer 710a in which the first quantum dots 710b may be dispersed.

The first photosensitive polymer 710a is not particularly limited as long as it may be a material having excellent dispersion characteristics and a light-transmitting property, but may include, for example, an acrylic resin, an imide-based resin, an epoxy-based resin, or a combination thereof.

The first quantum dots 710b may be excited by the blue incident light Li and isotropically emit the red light Lr having a longer wavelength than the wavelength of blue light. Herein, quantum dots may refer to crystals of a semiconductor compound, and may include any material capable of emitting light in various emission wavelength bands according to the sizes of the crystals.

The first quantum dots 710b may be synthesized using a wet chemical process, a metalorganic chemical vapor deposition (MOCVD) process, a molecular beam epitaxy (MBE) process, or a similar process. In the wet chemical process, quantum dot particle crystals may be grown after an organic solvent and a precursor material may be mixed. In case that the quantum dot particle crystals are grown, the organic solvent naturally serves as a dispersant coordinated on the surface of the quantum dot crystals and controls the growth of the crystal, and thus growth of the quantum dot particles may be controlled via a process that may be easier and more cost-effective than a vapor deposition method such as MOCVD or MBE.

The first quantum dots 710b may include a Groups II-VI elements-containing semiconductor compound, a Groups III-V elements-containing semiconductor compound, a Groups III-VI elements-containing semiconductor compound, a Groups I-III-VI elements-containing semiconductor compound, a Groups IV-VI elements-containing semiconductor compound, a Group IV element or compound, or any combination thereof.

Examples of the Groups II-VI elements-containing semiconductor compound may include a two-element compound such as CdS, CdSe, CdTe, ZnS, ZnSe, ZnTe, ZnO, HgS, HgSe, HgTe, MgSe, or MgS; a three-element compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS; a four-element compound such as CdZnSeS, CdZnSeTe, CdZnSTe, CdHgSeS, CdHgSeTe, CdHgSTe, HgZnSeS, HgZnSeTe, or HgZnSTe; and any combination thereof.

Examples of the Groups III-V elements-containing semiconductor compound may include a two-element compound such as GaN, GaP, GaAs, GaSb, AlN, AlP, AlAs, AlSb, InN, InP, InAs, or InSb; a three-element compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb; a four-element compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb; or any combination thereof. The Groups III-V elements-containing semiconductor compound may further include a Group II element. Examples of the Groups III-V elements-containing semiconductor compound further including a Group II element may include InZnP, InGaZnP, and InAlZnP.

Examples of the Groups III-VI elements-containing semiconductor compound may include a two-element compound such as GaS, GaSe, $Ga_2Se_3$, GaTe, InS, InSe, $In_2Se_3$, or InTe; a three-element compound such as $InGaS_3$ or $InGaSe_3$; and any combination thereof.

Examples of the Groups I-III-VI elements-containing semiconductor compound may include a three-element compound such as AgInS, $AgInS_2$, CuInS, $CuInS_2$, $CuGaO_2$, $AgGaO_2$, or $AgAlO_2$; or any combination thereof.

Examples of the Groups IV-VI elements-containing semiconductor compound may include a two-element compound such as SnS, SnSe, SnTe, PbS, PbSe, or PbTe; a three-element compound such as SnSeS, SnSeTe, SnSTe, PbSeS, PbSeTe, PbSTe, SnPbS, SnPbSe, or SnPbTe; a four-element compound such as SnPbSSe, SnPbSeTe, or SnPbSTe; and any combination thereof.

Examples of the Group IV element or compound may include a single-element compound such as Si or Ge; a two-element compound such as SiC or SiGe; or any combination thereof.

Each element included in a multi-element compound, such as the two-element compound, the three-element compound, or the four-element compound, may be present in particles at a uniform concentration or a non-uniform concentration.

The first quantum dots 710b may have a single structure or core-shell dual structure in which the concentration of each element included in the first quantum dots 710b may be uniform. For example, the material included in the core and the material included in the shell may be different from each other.

The shell may serve as a protective layer for maintaining semiconductor properties by preventing chemical denaturation of the core and/or may serve as a charging layer for imparting electrophoretic properties to the quantum dots. The shell may be a single layer or a multi-layer. An interface between the core and the shell may have a concentration gradient in which the concentration of elements present in the shell may be decreased as moving toward the center of the shell.

Examples of the shell may include oxide of a metal or a non-metal, a semiconductor compound, or a combination thereof. Examples of the oxide of a metal or a non-metal may include a two-element compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO; a three-element compound such as $MgAl_2O_4$, $CoFe_2O_4$, $NiFe_2O_4$, or $CoMn_2O_4$; and any combination thereof. Examples of the semiconductor compound may include a Groups III-VI elements-containing semiconductor compound; a Groups II-VI elements-containing semiconductor compound; a Groups III-V elements-containing semiconductor compound; a Groups III-VI elements-containing semiconductor compound; a Groups I-III-VI elements-containing semiconductor compound; a Groups IV-VI elements-containing semiconductor compound; and any combination thereof, as mentioned above. For example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The first quantum dots 710b may have a full width of half maximum (FWHM) of a light-emitting wavelength spectrum of about 45 nm or less, or about 40 nm or less, or about 30 nm or less, and in this range, color purity or color reproducibility may be improved. As light emitted through the first quantum dots 710b may be emitted in all directions, the viewing angle of the light may be improved.

Moreover, the shape of the first quantum dots 710b may be a sphere, a pyramid, a multi-arm, or a shape of a cubic nanoparticle, a cubic nanotube, a cubic nanowire, a cubic nanofiber, or a cubic nanoplate particle. The first scattering particles 710c may be further dispersed in the first photosensitive polymer 710a. The first scattering particles 710c may scatter the blue incident light Li not absorbed by the first quantum dots 710b, so that more first quantum dots 710b may be excited, thereby increasing color conversion efficiency of the first color conversion layer 710. The first scattering particles 710c may also scatter light in various directions regardless of an incidence angle without substantially converting the wavelength of incident light. Thus, side visibility may be improved.

The first scattering particles 710c may be particles having a different refractive index from that of the first photosensitive polymer 710a, for example, light scattering particles. The first scattering particles 710c are not particularly limited as long as they may be able to form an optical interface with the first photosensitive polymer 710a and partially scatter transmitted light. For example, the first scattering particles 710c may be particles of a metal oxide or particles of an organic material. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), and/or tin oxide ($SnO_2$), and examples of the organic material may include an acrylic resin or a urethane-based resin. The second color conversion layer 720 may convert the blue incident light Li to the green light Lg. The second color conversion layer 720 may include the second photosensitive polymer 720a in which the second quantum dots 720b may be dispersed, and the second scattering particles 720c may be dispersed together with the second quantum dots 720b within the second photosensitive polymer 720a, thereby increasing a color conversion rate of the second color conversion layer 720.

The second photosensitive polymer 720a may include the same material as the first photosensitive polymer 710a, and the second scattering particles 720c may include the same material as the first scattering particles 710c.

The second quantum dots 720b may include the same material as the first quantum dots 710b, and may each have the same shape as each of the first quantum dots 710b. However, the size of each of the second quantum dots 720b may be different from that of each of the first quantum dots 710b. For example, the size of each of the second quantum dots 720b may be less than that of each of the first quantum dots 710b so that the second quantum dots 720b may emit light having a different wavelength band from that of light emitted through the first quantum dots 710b. In detail, due to adjustment of the size of a quantum dot, an energy band gap may be adjusted, and thus light in various wavelength bands may be obtained. Each of the second quantum dots 720b has a smaller size than that of each of the first quantum dots 710b, and accordingly, the second quantum dots 720b may be excited by the blue incident light Li to isotropically emit the green light Lg having a longer wavelength than that of blue light and a shorter wavelength than that of the red light Lr.

The light-transmission layer 730 may include the third photosensitive polymer 730a in which the third scattering particles 730c may be dispersed. In other words, the light-transmission layer 730 may not include separate quantum dots that may be excited by the blue incident light Li. The third photosensitive polymer 730a may be formed of a light-transmitting organic material like the first photosensitive polymer 710a, and the third scattering particles 730c may include the same material as the first scattering particles 710c. Thus, the blue incident light Li incident upon the light-transmission layer 730 may pass through the light-transmission layer 730 without color conversion, and accordingly light emitted through the light-transmission layer 730 may be the blue light Lb. However, the blue incident light Li may be scattered by the third scattering particles 730c within the light-transmission layer 730 and may be emitted to the outside. The light-transmission layer 730 may transmit the blue incident light Li without color conversion, thereby obtaining higher luminescent efficiency.

Figure 6:
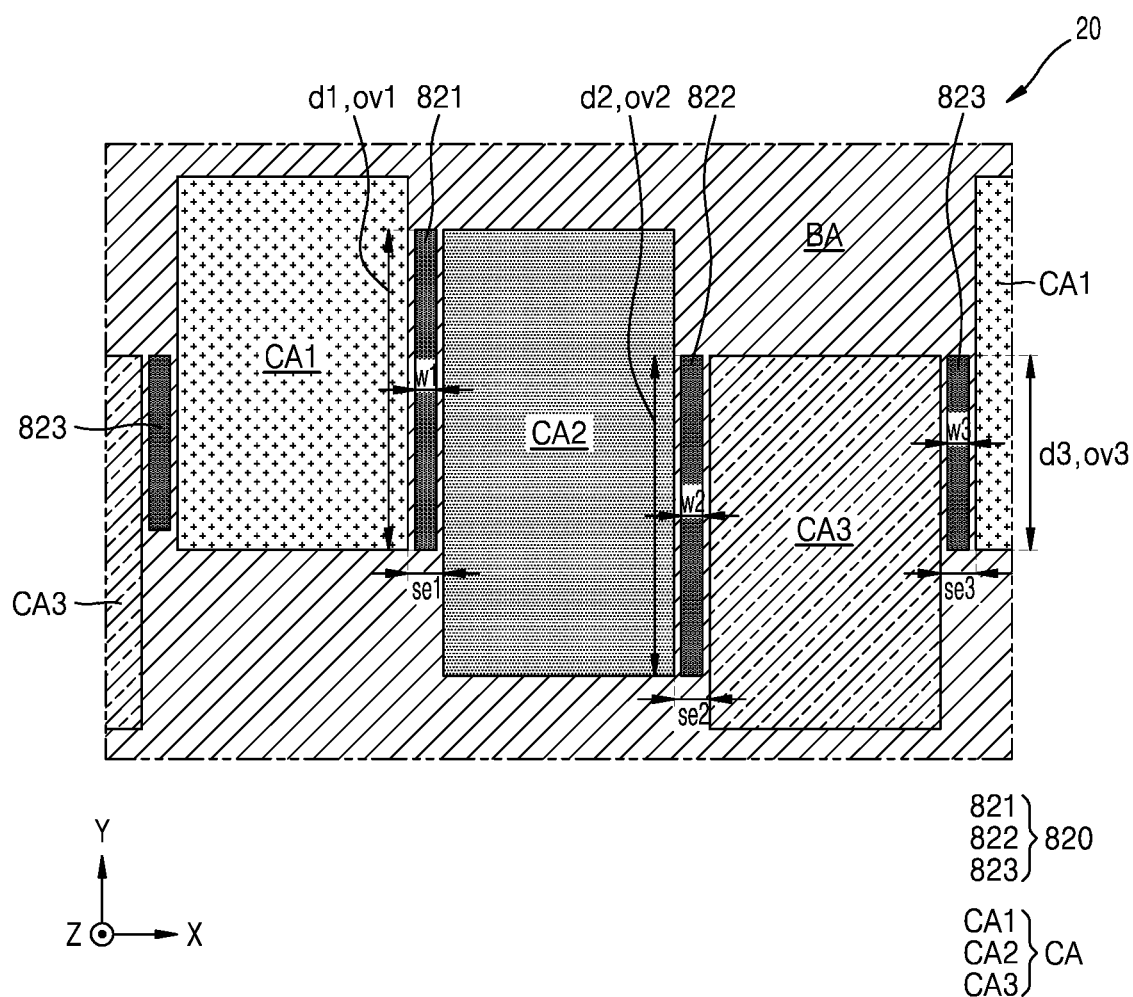
FIG. 6 is a schematic plan view of a portion of a color unit of a display apparatus according to an embodiment.

FIG. 6 is a schematic plan view of a portion of a color unit 20 of a display apparatus according to an embodiment. FIG. 6 focuses on arrangement of the first through third color areas CA1 through CA3 and the spacer 820 of the color unit 20.

Referring to FIG. 6, the first through third color areas CA1 through CA3 of the color unit 20 may be arranged apart from each other. The barrier area BA may be located between two adjacent color areas CA from among the first through third color areas CA1 through CA3, and may at least partially surround the first through third color areas CA1 through CA3.

Although FIG. 6 illustrates that each of the color areas CA may have a rectangular planar shape, embodiments are not limited thereto. Each of the color areas CA may have various shapes such as a polygon (such as a triangle or a pentagon), a diamond shape, a circle, and an ellipse. Planar sizes (e.g., areas) of the first through third color areas CA1 through CA3 may be equal to one another or different from one another. Because each of the color areas CA may correspond to the pixel PX of FIG. 1 of the display apparatus 1 of FIG. 1, arrangement of the color areas CA may be the same as arrangement of the pixels PX.

According to an embodiment, the spacer 820 may be located between two adjacent color areas CA from among the first through third color areas CA1 through CA3 in a planar view. For example, a first spacer 821 may be located between the first color area CA1 and the second color area CA2, a second spacer 822 may be located between the second color area CA2 and the third color area CA3, and a third spacer 823 may be located between the third color area CA3 and the first color area CA1. Although FIG. 6 illustrates all of the first through third spacers 821, 822, and 823, embodiments are not limited thereto, and at least one of the first through third spacers 821, 822, and 823 may be included.

According to an embodiment, a length of the spacer 820 in a first direction (for example, a y direction of FIG. 6) may be equal to a length by which two adjacent color areas CA overlap each other in a second direction (for example, an x direction of FIG. 6) perpendicular to the first direction.

For example, a first length d1 of the first spacer 821 in the first direction (y direction) may be equal to a first overlapping length ov1 of a portion where the first color area CA1 and the second color area CA2 adjacent to each other overlap each other in the second direction (x direction). The expression 'overlapping each other in the second direction' may refer to overlapping each other as viewed in the second direction on a virtual plan view including the second direction.

Similarly, a second length d2 of the second spacer 822 in the first direction (y direction) may be equal to a second overlapping length ov2 of a portion where the second color area CA2 and the third color area CA3 adjacent to each other overlap each other in the second direction (x direction). A third length d3 of the third spacer 823 in the first direction (y direction) may be equal to a third overlapping length ov3 of a portion where the third color area CA3 and the first color area CA1 adjacent to each other overlap each other in the second direction (x direction).

According to an embodiment, a width of the spacer 820 in the second direction (for example, the x direction of FIG. 6) may be equal to or less than a separation distance between two adjacent color areas CA. The separation distance may be defined as a shortest distance between the two adjacent color areas CA.

For example, a first width w1 of the first spacer 821 in the second direction (x direction) may be equal to or less than a first separation distance se1 between the first color area CA1 and the second color area CA2 adjacent to each other. A second width w2 of the second spacer 822 in the second direction (x direction) may be equal to or less than a second separation distance se2 between the second color area CA2 and the third color area CA3 adjacent to each other. A third width w3 of the third spacer 823 in the second direction (x direction) may be equal to or less than a third separation distance se3 between the third color area CA3 and the first color area CA1 adjacent to each other.

Figure 7:
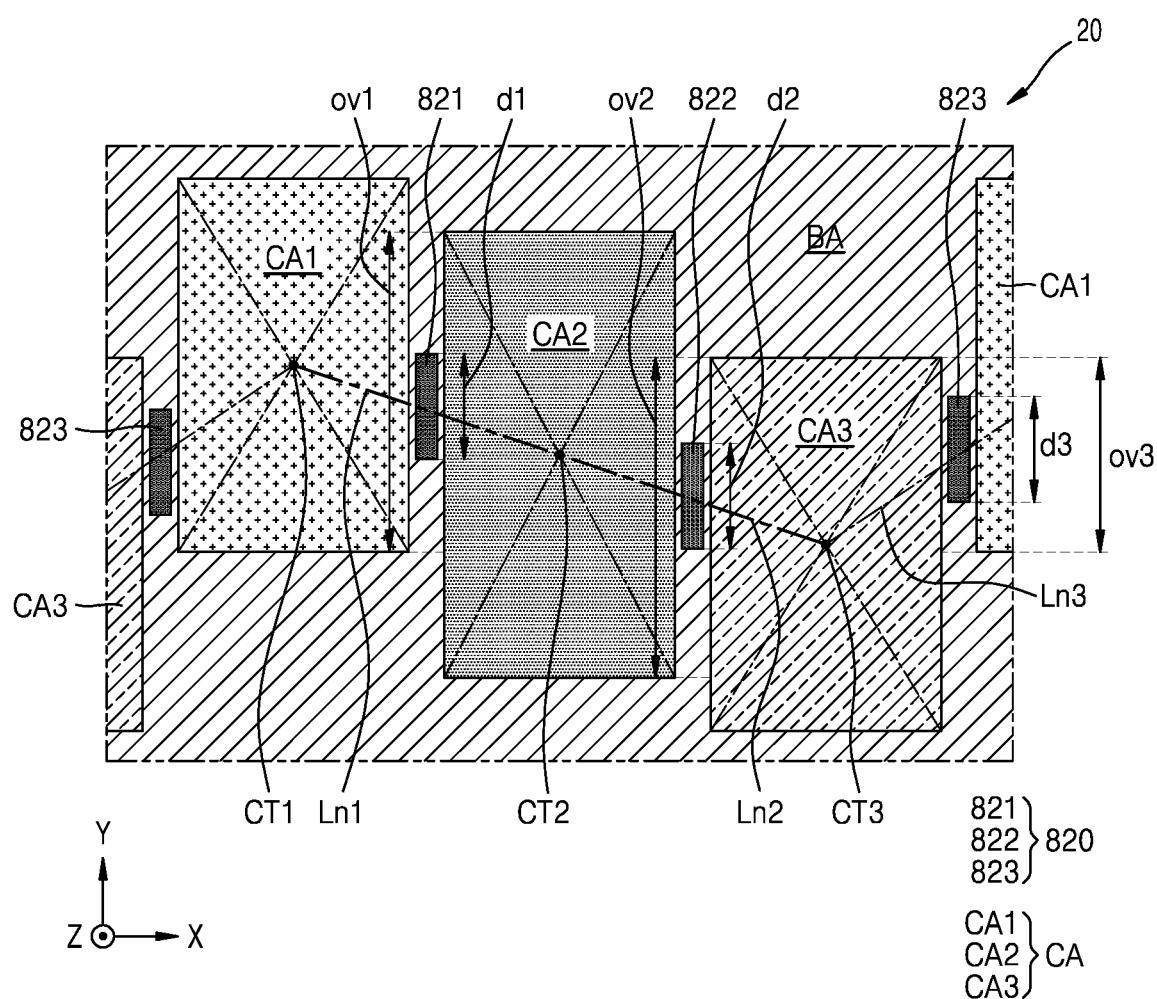
FIG. 7 is a schematic plan view of a portion of a color unit of a display apparatus according to another embodiment.

FIG. 7 is a schematic plan view of a portion of a color unit 20 of a display apparatus according to another embodiment of the disclosure. Description of the same components as those described above with reference to FIG. 6 will be omitted, and differences therebetween will now be described.

Referring to FIG. 7, according to an embodiment, a length of the spacer 820 in a first direction (for example, a y direction of FIG. 7) may be less than a length by which two adjacent color areas CA overlap each other in a second direction (for example, an x direction of FIG. 7) perpendicular to the first direction.

For example, a first length d1 of the first spacer 821 in the first direction (y direction) may be less than a first overlapping length ov1 of a portion where the first color area CA1 and the second color area CA2 adjacent to each other overlap each other in the second direction (x direction). Similarly, a second length d2 of the second spacer 822 in the first direction (y direction) may be less than a second overlapping length ov2 of a portion where the second color area CA2 and the third color area CA3 adjacent to each other overlap each other in the second direction (x direction). A third length d3 of the third spacer 823 in the first direction (y direction) may be less than a third overlapping length ov3 of a portion where the third color area CA3 and the first color area CA1 adjacent to each other overlap each other in the second direction (x direction).

In case that an area where the spacer 820 is arranged increases, an area where the filler 830 of FIG. 4 is arranged may decrease by as much as the increase, and may be insufficiently formed. Accordingly, in an undesirable case, a buffering effect of the filler 830 may be degraded, and thus the possibility that the light-emitting element 200 of FIG. 4 and/or the color-conversion transmission layer 700 of FIG. 4 may be damaged may be increased. An adhesion effect of the filler 830 may be degraded, resulting in unexpected separation between the light-emitting unit 10 of FIG. 4 and the color unit 20 of FIG. 4. To minimize this problem, as shown in FIG. 7, a length of the spacer 820 in the first direction (y direction) may be made less than a length by which two adjacent color areas CA overlap each other in the second direction (x direction).

According to an embodiment, the spacer 820 may be located to intersect a virtual line that connects respective centers of two adjacent color areas CA from among the first through third color areas CA1 through CA3 in a planar view. For example, the first spacer 821 may be located to intersect a first line Ln1, wherein the first line Ln1 may be a virtual line that connects a first center CT1 of the first color area CA1 and a second center CT2 of the second color area CA2 to each other, and the first color area CA1 and the second color area CA2 may be adjacent to each other.

Similarly, the second spacer 822 may be located to intersect a second line Ln2, wherein the second line Ln2 may be a virtual line that connects the second center CT2 of the second color area CA2 and a third center CT3 of the third color area CA3 to each other, and the second color area CA2 and the third color area CA3 may be adjacent to each other. The third spacer 823 may be located to intersect a third line Ln3, wherein the third line Ln3 may be a virtual line that connects the third center CT3 of the third color area CA3 and the first center CT1 of the first color area CA1 to each other, and the third color area CA3 and the first color area CA1 may be adjacent to each other.

As such, the spacer 820 may be arranged in an area where light that causes color mixing (e.g., light introduced not from a corresponding light-emitting element but from an adjacent light-emitting element) may pass most. Accordingly, even in case that the length of the spacer 820 is shortened, a decrease in the effect of preventing color mixing of the spacer 820 may be minimized.

Figure 8:
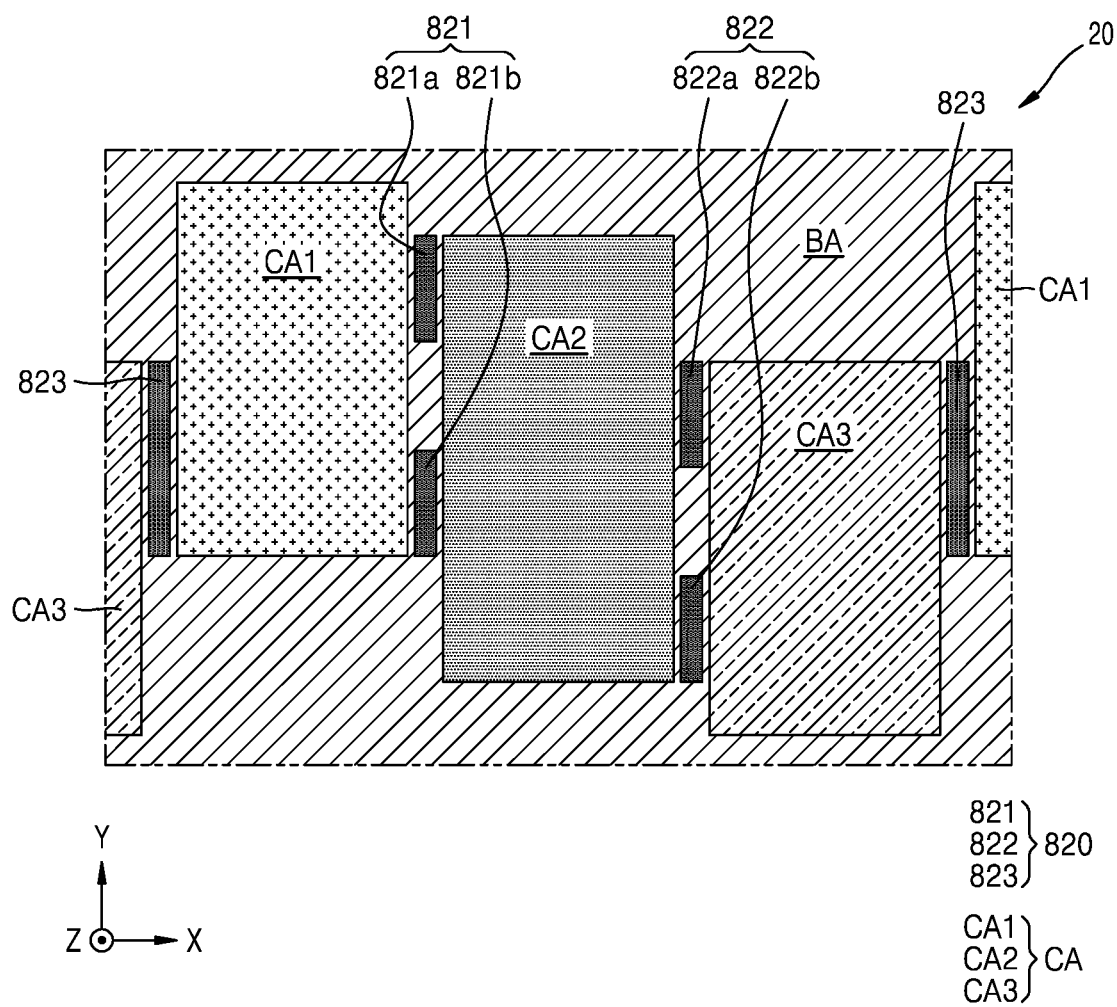
FIG. 8 is a schematic plan view of a portion of a color unit of a display apparatus according to another embodiment.

FIG. 8 is a schematic plan view of a portion of a color unit 20 of a display apparatus according to another embodiment of the disclosure. Description of the same components as those described above with reference to FIGS. 6 and 7 will be omitted, and differences therebetween will now be described.

Referring to FIG. 8, spacers 820 may be located between two adjacent color areas CA. According to an embodiment, two first spacers 821 may be arranged between the first color area CA1 and the second color area CA2 adjacent to each other. For example, a 1-1$^{st}$ spacer 821a and a 1-2$^{nd}$ spacer 821b may be arranged. This is merely an example, and three or more first spacers 821 may be arranged between the first color area CA1 and the second color area CA2 adjacent to each other.

Similarly, two second spacers 822 may be arranged between the second color area CA2 and the third color area CA3 adjacent to each other. For example, a 2-1$^{st}$ spacer 822a and a 2-2$^{nd}$ spacer 822b may be arranged.

As such, the number of spacers 820 and a layout thereof may be modified and designed variously.

Although only a display apparatus has been described above, embodiments are not limited thereto. For example, a method of manufacturing such a display apparatus also belongs within the scope of the disclosure.

According to an embodiment as described above, occurrence of a defect of a blue pixel may be minimized, and color mixing between pixels that emit light beams of different colors may be prevented. Accordingly, a display apparatus with an improved color reproduction rate and an improved display quality may be realized. Of course, the scope of the disclosure is not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims including equivalents thereof.

What is claimed is:

1. A display apparatus comprising:
a light-emitting unit comprising light-emitting elements; and
a color unit disposed on the light-emitting unit and comprising a first color area, a second color area, and a third color area that overlap the light-emitting elements and emit light beams of different colors,
wherein the color unit comprises:
a light-transmission layer comprising a first opening corresponding to the first color area and a second opening corresponding to the second color area, such that the light-transmission layer overlaps the third color area, an area between the first color area and the second color area, an area between the second color area and the third color area, and an area between the third color area and the first color area;
a first color conversion layer disposed within the first opening of the light-transmission layer;
a second color conversion layer disposed within the second opening of the light-transmission layer; and
a spacer disposed on a surface of the light-transmission layer facing the light emitting unit and between two adjacent color areas among the first color area, the second color area, and the third color area, the spacer comprising a light shielding material.

2. The display apparatus of claim 1, wherein a length of the spacer in a first direction is equal to or less than a length of an area where the two adjacent color areas overlap each other in a second direction intersecting the first direction.

3. The display apparatus of claim 2, wherein a width of the spacer in the second direction is equal to or less than a separation distance between the two adjacent color areas.

4. The display apparatus of claim 1, wherein the spacer is disposed to intersect a virtual line that connects respective centers of two adjacent color areas among the first color area, the second color area, and the third color area in plan view.

5. The display apparatus of claim 1, wherein the spacer of the color unit extends to the light-emitting unit.

6. The display apparatus of claim 1, wherein
each of the light-transmission layer, the first color conversion layer, and the second color conversion layer comprises scattering particles, and
the first color conversion layer and the second color conversion layer comprise a first quantum dot and a second quantum dot, respectively, and
the first quantum dot and the second quantum dot include same materials and have different sizes.

7. The display apparatus of claim 1, wherein the color unit further comprises:
a first color filter layer corresponding to the first color area;
a second color filter layer corresponding to the second color area; and
a third color filter layer corresponding to the third color area.

8. The display apparatus of claim 7, wherein the first color filter layer, the second color filter layer, and the third color filter layer overlap one another in a light shielding area between two adjacent color areas among the first color area, the second color area, and the third color area in plan view.

9. The display apparatus of claim 7, wherein the color unit further comprises a refractive layer which has a refractive index less than a refractive index of each of the first color conversion layer, the second color conversion layer, and the light-transmission layer, between the first color filter layer and the first color conversion layer, between the second color filter layer and the second color conversion layer, and between the third color filter layer and the light-transmission layer.

10. The display apparatus of claim 1, wherein each of the light-emitting elements comprises:
a pixel electrode;
an opposite electrode on the pixel electrode; and
an emission layer between the pixel electrode and the opposite electrode.

11. A display apparatus comprising:
a first substrate;
a first light-emitting element, a second light-emitting element, and a third light-emitting element, which are disposed on the first substrate;
a second substrate disposed on the first substrate such that the first light-emitting element, the second light-emitting element, and the third light-emitting element are disposed therebetween;
a light-transmission layer disposed on a surface of the second substrate that faces the first substrate, the light-transmission layer comprising a first opening overlapping the first light-emitting element and a second opening overlapping the second light-emitting element, such that the light-transmission layer overlaps the third light-emitting element, an area between the first light-emitting element and the second light-emitting element, an area between the second light-emitting element and the third light-emitting element, and an area between the third light-emitting element and the first light-emitting element;
a first color conversion layer disposed within the first opening of the light-transmission layer;
a second color conversion layer disposed within the second opening of the light-transmission layer;
at least one capping layer covering the light-transmission layer, the first color conversion layer, and the second color conversion layer; and
a spacer disposed on a surface of the light-transmission layer facing the first substrate and disposed between the first and second openings, the spacer comprising a light shielding material.

12. The display apparatus of claim 11, further comprising:
a first color filter layer overlapping the first color conversion layer and disposed between the second substrate and the first color conversion layer;
a second color filter layer overlapping the second color conversion layer and disposed between the second substrate and the second color conversion layer; and
a third color filter layer overlapping at least a portion of the light-transmission layer and disposed between the second substrate and the light-transmission layer.

13. The display apparatus of claim 12, wherein at least a portion of the first color filter layer, at least a portion of the second color filter layer, and at least a portion of the third color filter layer overlap each other.

14. The display apparatus of claim 12, wherein
the third color filter layer comprises a first hole corresponding to the first color conversion layer, and a second hole corresponding to the second color conversion layer,
the second color filter layer comprises a third hole corresponding to a portion of the light-transmission layer, and a fourth hole overlapping the first hole and defining the first color area, and
the first color filter layer comprises a fifth hole overlapping the second hole and defining a second color area, and a sixth hole overlapping the third hole and defining a third color area.

15. The display apparatus of claim 14, wherein
the spacer is disposed between two adjacent color areas among the first color area, the second color area, and the third color area, and
a length of the spacer in a first direction is equal to or less than a length of an area where the two adjacent color areas overlap each other in a second direction intersecting the first direction.

16. The display apparatus of claim 14, wherein the spacer is disposed to intersect a virtual line that connects respective centers of two adjacent color areas among the first color area, the second color area, and the third color areas in plan view.

17. The display apparatus of claim 11, wherein
each of the light-transmission layer, the first color conversion layer, and the second color conversion layer comprises scattering particles,
the first color conversion layer and the second color conversion layer comprise a first quantum dot and a second quantum dot, respectively, and
the first quantum dot and the second quantum dot include same materials and have different sizes.

18. The display apparatus of claim 11, wherein each of the first light-emitting element, the second light-emitting element, and the third light-emitting element comprises:
a pixel electrode;
an opposite electrode on the pixel electrode; and
an emission layer between the pixel electrode and the opposite electrode.

19. The display apparatus of claim 18, further comprising an encapsulation layer disposed on the first substrate to cover the first light-emitting element, the second light-emitting element, and the third light-emitting element,
wherein the spacer is disposed between the at least one capping layer and the encapsulation layer and extends to the encapsulation layer.

20. The display apparatus of claim 12, further comprising a refractive layer which has a refractive index less than a refractive index of each of the first color conversion layer the second color conversion layer, and the light-transmission layer, between the first color filter layer and the first color conversion layer, between the second color filter layer and the second color conversion layer, and between the third color filter layer and the light-transmission layer.

* * * * *